(12) United States Patent
Sriraman et al.

(10) Patent No.: US 8,338,296 B2
(45) Date of Patent: Dec. 25, 2012

(54) METHOD FOR FORMING A CATALYST SUITABLE FOR GROWTH OF CARBON NANOTUBES

(75) Inventors: Hari Pathangi Sriraman, Leuven (BE); Ann Witvrouw, Herent (BE); Philippe M. Vereecken, Liège (BE)

(73) Assignees: IMEC, Leuven (BE); Katholieke Universiteit Leuven, K.U. LEUVEN R&D, Leuven (BE)

( * ) Notice: Subject to any disclaimer, the term of this patent is extended or adjusted under 35 U.S.C. 154(b) by 106 days.

(21) Appl. No.: 13/096,310

(22) Filed: Apr. 28, 2011

(65) Prior Publication Data

US 2011/0315951 A1    Dec. 29, 2011

Related U.S. Application Data

(60) Provisional application No. 61/359,730, filed on Jun. 29, 2010.

(51) Int. Cl.
*H01L 21/441* (2006.01)

(52) U.S. Cl. . 438/674; 977/890; 977/893; 257/E21.536; 257/E21.585

(58) Field of Classification Search .......... 257/618, 257/E21.536, E21.585; 438/50, 674; 977/890, 977/893
See application file for complete search history.

(56) References Cited

U.S. PATENT DOCUMENTS

| | | | |
|---|---|---|---|
| 6,472,459 B2 * | 10/2002 | Morales et al. | 524/439 |
| 6,596,187 B2 * | 7/2003 | Coll et al. | 216/56 |
| 6,689,674 B2 * | 2/2004 | Zhang et al. | 438/584 |
| 6,803,840 B2 * | 10/2004 | Hunt et al. | 333/186 |
| 6,887,365 B2 * | 5/2005 | Naughton | 205/104 |
| 6,958,216 B2 * | 10/2005 | Kelley et al. | 506/39 |
| 7,005,391 B2 * | 2/2006 | Min et al. | 438/778 |
| 7,053,520 B2 * | 5/2006 | Zetti et al. | 310/309 |
| 7,115,306 B2 | 10/2006 | Jeong et al. | |
| 7,214,303 B2 * | 5/2007 | Naughton | 205/104 |
| 7,319,069 B2 * | 1/2008 | Den et al. | 438/667 |
| 7,446,044 B2 * | 11/2008 | Kaul et al. | 438/684 |
| 7,453,183 B2 * | 11/2008 | Zettl et al. | 310/309 |
| 7,462,270 B2 * | 12/2008 | Naughton | 205/104 |
| 7,538,015 B2 * | 5/2009 | Kadono et al. | 438/497 |
| 7,572,669 B2 * | 8/2009 | Tuominen et al. | 438/99 |
| 7,850,941 B2 * | 12/2010 | Tsakalakos et al. | 423/445 R |
| 8,030,191 B2 * | 10/2011 | Kadono et al. | 438/497 |
| 2008/0233744 A1 * | 9/2008 | Kaul et al. | 438/684 |

OTHER PUBLICATIONS

Chai et al., "Electron-shading effect on the horizontal aligned growth of carbon nanotubes", Applied Physics Letters 94, 043116 (2009).
Chai et al., "Fabrication and Characterization of Horizontally Aligned Carbon Nanotubes for Interconnect Application", 2009 Electronic Components and Technology Conference, 1465-1469, 978-1-4244-4476-2/09/$25.00 © 2009 IEEE.

(Continued)

*Primary Examiner* — Evan Pert
(74) *Attorney, Agent, or Firm* — Knobbe Martens Olson & Bear LLP

(57) ABSTRACT

The present disclosure is related to a method for forming a catalyst nanoparticle on a metal surface, the nanoparticle being suitable for growing a single nanostructure, in particular a carbon nanotube, the method comprising at least the steps of: providing a substrate, having a metal layer on at least a portion of the substrate surface, depositing a sacrificial layer at least on the metal layer, producing a small hole in the sacrificial layer, thereby exposing the metal layer, providing a single catalyst nanoparticle into the hole, removing the sacrificial layer. The disclosure is further related to growing a carbon nanotube from the catalyst nanoparticle.

17 Claims, 7 Drawing Sheets

OTHER PUBLICATIONS

Franklin et al., "Integration of suspended carbon nanotube arrays into electronic devices and electromechanical systems", App. Phys. Lett., 81 (5), 913, 2002.

Ural et al., "Electric-field-aligned growth of single-walled carbon nanotubes on surfaces", Applied Physics Letters 81(18), 3464-3466 (2002).

Vijayaraghavan et al., "Ultra-Large-Scale Directed Assembly of Single-Walled Carbon Nanotube Devices", Nano Lett.., 7 (6), 1556-1560, 2007.

Yaakobowitch et al., "Carbon Nanotube Self-Assembeled High Frequency Resonator", Proc. MEMS 2010, 432., 978-1-4244-5764-9/10/$26.00 © 2010 IEEE.

* cited by examiner

METHOD FOR FORMING A CATALYST SUITABLE FOR GROWTH OF CARBON NANOTUBES

CROSS-REFERENCE TO RELATED APPLICATIONS

This application claims the benefit under 35 U.S.C. §119 (e) of U.S. Provisional Application No. 61/359,730, filed Jun. 29, 2010, the disclosure of which is hereby expressly incorporated by reference in its entirety and is hereby expressly made a portion of this application.

FIELD OF THE INVENTION

The present disclosure is related to the formation of a catalyst and to the formation of carbon nanostructures formed onto the catalyst. The present disclosure is related to methods for forming at least one elongated nanostructure in semiconductor devices such as transistors, Micro-Electro-Mechanical Systems (MEMS) and Nano-Electro-Mechanical Systems (NEMS) and to the devices obtained by such methods.

BACKGROUND OF THE INVENTION

Nanostructures such as Nanowires (NWs) and Carbon Nanotubes (CNTs) have been identified as some of the most promising candidates to extend and even replace materials currently used in microelectronic manufacturing processes. For example, metallic CNTs have been proposed as nanoelectronic interconnects due to their high current carrying capacity, whereas semiconducting CNTs have been indicated as nanoscale transistor elements due to their large range band gap. Both metallic and semiconducting CNTs are also, due to their excellent mechanical properties, promising structural materials for Micro-Electro-Mechanical Systems (MEMS) and Nano-Electro-Mechanical Systems (NEMS). These and similar applications cannot be fully accomplished yet since the fabrication of nanostructures still faces a variety of unsolved issues, which vary from one application to another but may, however, be similar in some aspects.

A first issue is related to the growth of nanostructures in a predefined direction e.g. a growth which is substantially parallel to a main surface of a substrate i.e. in a direction, when the main surface of the substrate is lying in a plane, substantially parallel to the plane of the main substrate.

Thermal and/or plasma enhanced chemical vapor deposition (CVD) have been used extensively to grow carbon nanotubes (CNTs) and pattern devices around them. However, the methods reported in the state of the art to grow these CNTs lack either one or at least the combination of following parameters: predictability and control in terms of CNT density, on-chip location, and orientation. For transistor applications and for use in MEMS and NEMS, it would be extremely advantageous to achieve horizontal single CNT growth between electrode pairs.

In prior art methods, controlling on-chip CNT density and position has been achieved by dielectrophoresis, see R. Krupke et al., Nano Lett., 7 (6), 1556, 2007. This is a technique that makes use of a non-uniform electric field to align pre-grown CNTs dispersed in a liquid medium on to a surface. This is a non-standard processing technique and does not yield very good contact resistance (CNTs just stuck by Van der Waals forces). There have also been attempts to grow aligned CNTs by using an in-situ electric field between 2 large electrodes during CVD, for example H. Dai et al., App. Phys. Lett., 81 (5), 913, 2002. Also localized growth by CVD has been attempted by defining Si-oxide islands on TiN electrodes (on both electrodes of the electrode pair). See Yaakobowitch et al, Proc. MEMS 2010, 432. The catalyst particles are here still spread out over the whole wafer, but growth happens preferentially on the oxide islands. The pictures shown in this reference clearly indicate that CNTs also grown on other parts of the wafer and also many catalyst particles are present on Si-oxide islands of both electrodes, making the growth of a single CNT not realistic. Furthermore, electrical contact is only achieved when the CNT also touches the TiN electrode as Si-oxide is non-conducting.

SUMMARY OF THE INVENTION

The disclosure is related to a method as disclosed in the appended claims.

According to an embodiment, a method is disclosed for providing a single catalyst nanoparticle on predefined on-chip location on a main surface of a substrate, the main surface lying in a plane. The method comprises at least the steps of: obtaining a substrate, and then providing onto the substrate arrays of (triangular) conductive electrode pairs, and then Providing a sacrificial layer and defining small holes in the sacrificial layer on top of one of the electrodes of the electrode pairs, and then Selectively providing a single catalyst nanoparticle into the exposed holes using electro chemical deposition (ECD) from a bath comprising metal salts selected from Ni, Co or Fe comprising salts.

In a second aspect of the disclosure, a method is disclosed for providing (growing) a nanostructure (CNT) having a desired horizontal alignment. The horizontal growth (alignment) makes it possible to bridge e.g. the gap in between 2 electrodes of an electrode pair which is desired for the use of CNT in MEMS and NEMS applications.

More generally, the disclosure is related to a method for forming a catalyst nanoparticle on a metal surface, the nanoparticle being suitable for growing a single nanostructure, in particular a carbon nanotube, the method comprising at least the steps of: providing a substrate, having a metal layer on at least a portion of the substrate surface, depositing a sacrificial layer at least on the metal layer, producing a small hole in the sacrificial layer, thereby exposing the metal layer, providing a single catalyst nanoparticle into the hole, removing the sacrificial layer.

According to an embodiment, the method comprises the steps of: providing a substrate, providing onto the substrate at least one pair of electrodes, the electrodes forming the metal layer, depositing a sacrificial layer at least on the electrodes, producing a small hole in the sacrificial layer on top of one of the electrodes of the electrode pair, providing a single catalyst nanoparticle into the hole, removing the sacrificial layer.

The step of producing the small hole may be performed by electron beam or advanced optical lithography. The sacrificial layer may be a photosensitive layer. The hole may be a few tens of nanometer in diameter, preferably between 50 nm and 100 nm.

According to an embodiment, the material of the catalyst nanoparticle is Ni, Co, Fe or an alloy of either of these metals with Mo.

According to an embodiment, the catalyst nanoparticle is selectively provided into the exposed hole. Preferably, the nanoparticle is selectively provided using electro chemical deposition (ECD) from a bath comprising metal salts such as nickel sulfate and sodium.

According to an embodiment, the material of the catalyst is Ni and the metal layer is a layer of TiN, and: the bath comprises a Ni-containing species, with the concentration in the bath of the Ni-containing species being between 0.01M and 1M, the deposition takes place at a constant voltage applied to the substrate, wherein the voltage is between −1.3V and −1.8V relative to a reference electrode, the deposition takes place in a time span between 100 ms and 2 s.

In the method of the disclosure, the catalyst nanoparticle may be provided into the exposed hole using Physical Vapor Deposition (PVD).

In the method of the disclosure, the step of providing a single nanoparticle may comprise: depositing a plurality of nanoparticles in and/or in the vicinity of the hole, heating up the substrate to a temperature above the melting point of the particles, to thereby obtain the coalescing of a number of the plurality of nanoparticles, into a single nanoparticle in the hole.

According to an embodiment, the method of the disclosure further comprises the step of growing a single carbon nanostructure onto the catalytic nanoparticle in a Chemical Vapor Deposition (CVD) chamber, more preferably a Plasma-Enhanced Chemical Vapor Deposition (PE-CVD) chamber, at a temperature ranging from 400° C. to 700° C.

The carbon source of the CVD process may be selected from methane, ethylene or acetylene with or without carrier gases like Ar and $N_2$ and wherein the CNT growth is carried out at a low pressure ranging from 1 torr to 4 torr with a 13.56 MHz radio frequency plasma generator or remote microwave plasma.

According to an embodiment, the metal layer comprises at least one pair of electrodes, the nanoparticle being provided on top of one of the electrodes and wherein the nanostructure is having a desired horizontal growth achieved by biasing the sample holder in the CVD chamber, thereby creating a localized electric field between the electrodes.

The disclosure is equally related to a semiconductor device comprising a single carbon nanostructure grown on a single catalyst nanoparticle, obtainable by the method of any the disclosure. The device of the disclosure may be a MEMS or NEMS device.

The method of the disclosure makes it possible to achieve a single nanostructure (CNT) which is suspended and allows free motion above a substrate.

The method of the disclosure has the advantage that it contains processing steps which allow large-scale production towards MEMS and NEMS applications like, but not limited to, resonator arrays or as nano hinges for micro (nano) mirror arrays. The above objectives are accomplished by methods and devices according to the present disclosure.

The methods according to embodiments of the disclosure are scalable and fully compatible with existing semiconductor processing.

Furthermore, methods according to embodiments of the disclosure can allow the growth of a single elongated nanostructure such as a CNT with control over the diameter, growth direction, and length.

BRIEF DESCRIPTION OF THE DRAWINGS

All drawings are intended to illustrate some aspects and embodiments of the present disclosure. Not all alternatives and options are shown and therefore the disclosure is not limited to the content of the attached drawings. Like numerals are used to reference like parts in the different figures. The figures may show preferred embodiments.

DETAILED DESCRIPTION OF THE PREFERRED EMBODIMENT

Figure 1A:
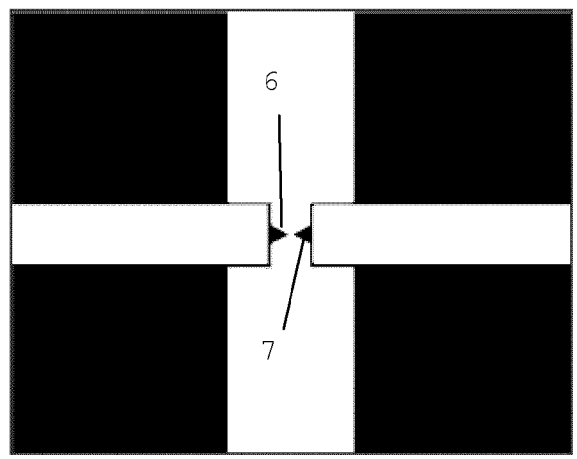
FIGS. 1a-1c illustrate triangular structures with configurations including 2-probe and 4-probe arrangements and arrays of electrodes which may be used in a method according to embodiments of the present disclosure.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

In the description provided herein, numerous specific details are set forth. However, it is understood that embodiments of the disclosure may be practiced without these specific details. In other instances, well-known methods, structures, and techniques have not been shown in detail in order not to obscure an understanding of this description.

The disclosure will be described by a detailed description of embodiments of the disclosure. It is clear that other embodiments of the disclosure can be configured according to the knowledge of persons skilled in the art without departing from the true spirit or technical teaching of the disclosure, the disclosure being limited only by the terms of the appended claims.

The disclosure is related to a method for forming a catalyst nanoparticle on a metal surface, the nanoparticle being suitable for growing a single nanostructure, in particular a carbon nanotube. The method comprises at least the steps of: providing a substrate, having a metal layer on the substrate surface, depositing a sacrificial layer on the metal layer, producing a small hole in the sacrificial layer, thereby exposing the metal layer, providing a single catalyst nanoparticle into the hole, removing the sacrificial layer.

According to a preferred embodiment, the substrate is preferably a semiconductor substrate, and the metal layer is provided in the form of at least one pair of planar electrodes. The sacrificial layer is then deposited on the electrodes and preferably also on the remainder of the substrate surface. The small hole is produced in the sacrificial layer on top of one of the electrodes. This embodiment is primarily aimed at providing a catalyst nanoparticle suitable for growing a carbon nanostructure such as a carbon nanotube (CNT), the structure growing directionally from one electrode to the other electrode of the electrode pair (see further). The remainder of this description is based on the preferred embodiment involving planar electrodes. Unless indicated or obvious from the context, the present description is valid for any embodiment that does not involve planar electrode pairs.

Figure 1B:
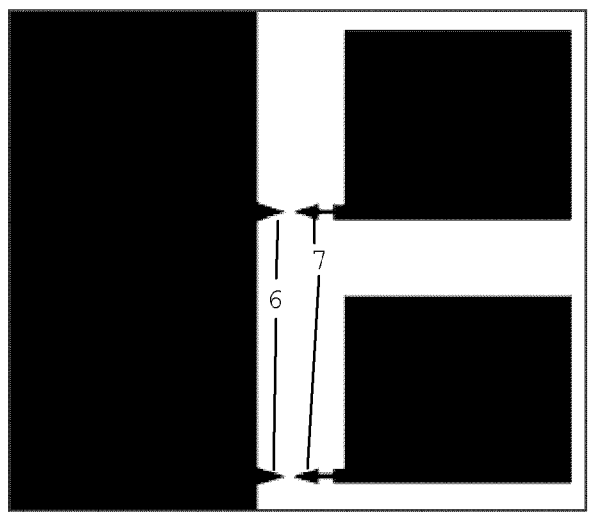
Figure 1C:
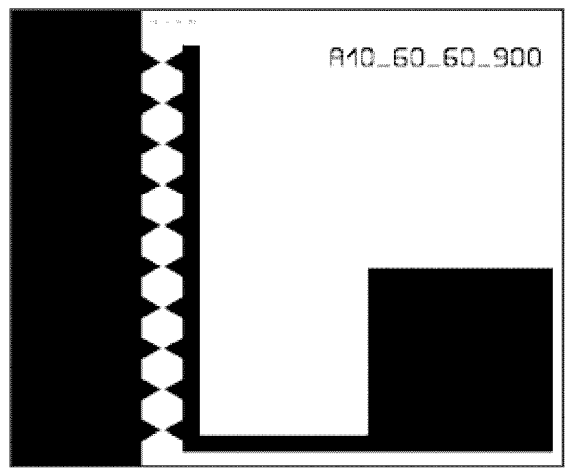
Figure 2:
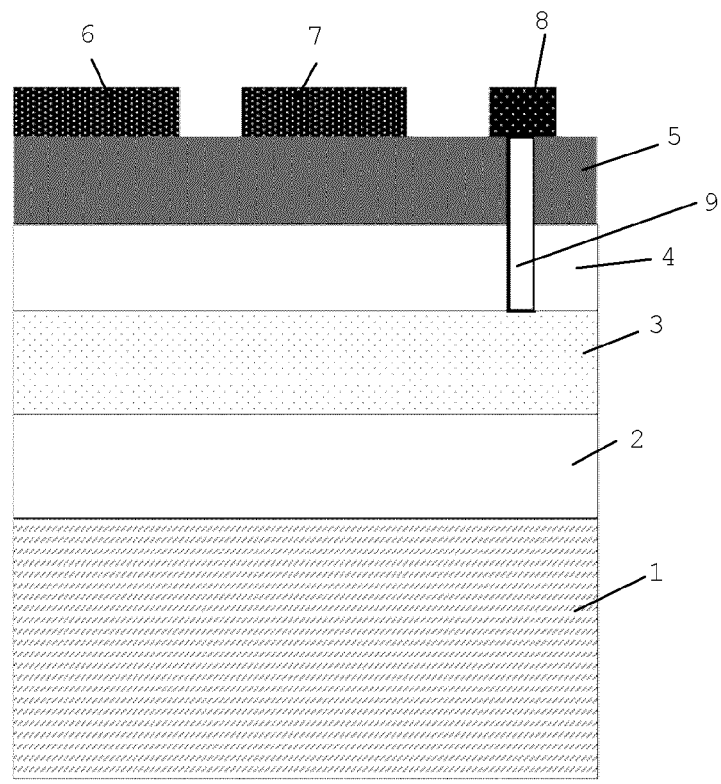
FIG. 2 illustrates a suitable stack of materials which may be used in the fabrication of template electrode structures on a 200 mm wafer-scale.

According to a preferred embodiment, the electrodes are triangular-shaped. The electrodes may be provided in one or more arrays of (triangular) electrode pairs, as illustrated in FIG. 1. The step of providing one or more (arrays of) electrode pairs onto the substrate is preferably performed by using optical lithography like, but not limited to, deep ultraviolet (DUV 248 nm) lithography. The electrode structures used as templates for catalyst deposition and subsequent CNT growth are designed in such a manner that wafer-scale electrochemical deposition (ECD) of the catalyst and hence CVD (PE-CVD) deposition of CNTs can be carried out on one electrode for each electrode pair. The electrode pairs may be fabricated on a semiconductor wafer (e.g. a 200 mm or 300 mm wafer-scale) and may comprise or consist of any metallic layer, such as for instance TiN, Pt or Pd, placed on and in contact with an insulating under-layer such as silicon dioxide or amorphous silicon carbide. FIG. 2 illustrates a stack of materials used in the fabrication of the electrodes: a base substrate 1 (e.g. a Si wafer), a first SiO$_2$ layer 2, an Al layer 3, a second SiO$_2$ layer 4, a SiC layer 5 (i.e. the insulating under-layer), and an electrode pair 6/7. The Al layer is present to form a connection via contact plug 9 form a contact region 8 on the substrate. Any suitable technique known in the art can be applied to produce the substrate as shown in FIG. 2.

Figure 3:
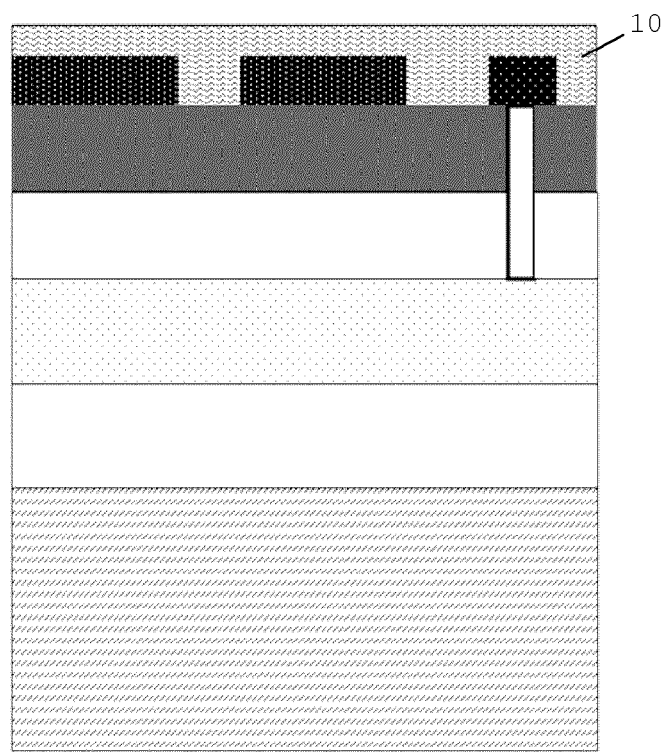
FIG. 3 illustrates the step of providing first a photosensitive layer onto the stack of materials comprising the electrode structures (pairs).

Onto the substrate shown in FIG. 2, a sacrificial layer 10 is deposited, see FIG. 3. This can be a photosensitive layer. It can however be any suitable layer, for example a silicon oxide layer, which can be patterned by photolithography step.

Figure 4:
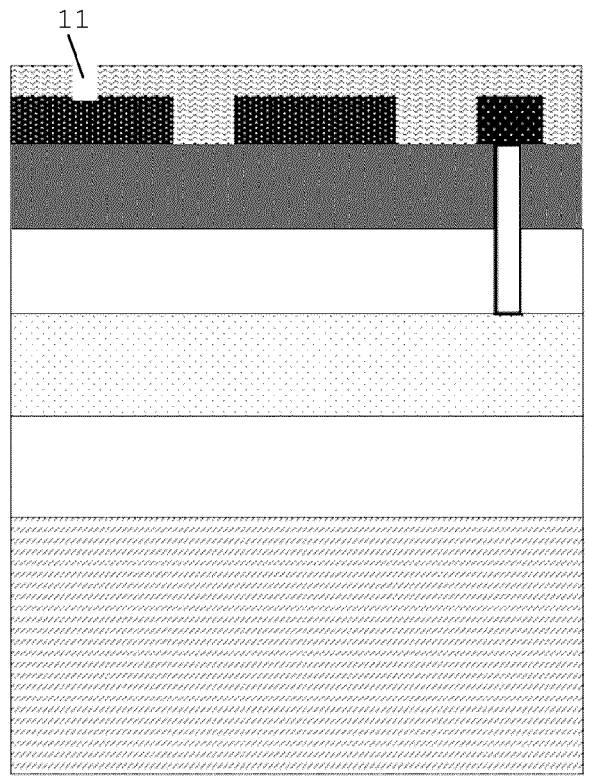
FIG. 4 illustrates the step of patterning a small hole on a predefined area of one of the electrodes (on tip).

In the next step (FIG. 4), a small hole 11 is produced in the sacrificial layer 10, on a predefined location above one of the electrodes 6. Defining the small hole on top of one of the electrodes of the electrode pairs may be performed either by electron beam or advanced optical lithography (e.g. 193 nm lithography), i.e. by patterning the hole in the photosensitive layer 10. The small hole is preferably a few tens of nanometer in diameter, preferably in the range of 50-100 nm, for example 70 nm.

Figure 5:
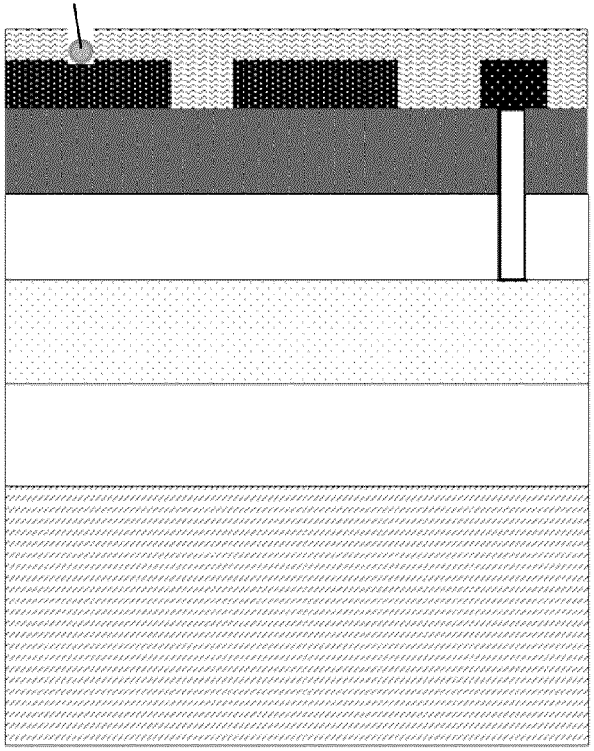
FIG. 5 illustrates the step of providing a single catalytic nanoparticle into the predefined openings (holes).

The catalyst required for CNT growth is only required at the specific location on the pre-fabricated electrode structure defined by the small hole. FIG. 5 illustrates the step of selectively providing a single catalytic nanoparticle 12 into the predefined hole.

According to a preferred embodiment, the material of the catalyst nanoparticle is Ni, Co, Fe or an alloy of either of these metals with Mo. The catalyst nanoparticle 12 may be provided into the exposed hole using electro chemical deposition (ECD) from a bath comprising metal salts such as nickel sulfate and sodium. Deposition of catalytic (metal) material takes place only, i.e. selectively, in the exposed metallic areas.

The electrochemical deposition process preferably involves immersing the metallic electrode layers in an aqueous solution comprising metal salts such as nickel sulfate or nickel nitrate with the presence of supporting electrolytes such as sodium citrate, sodium chloride, ammonium chloride, ammonium hydroxide or any combination thereof. A constant negative DC potential or a constant negative current is then applied to the electrical circuit (meaning to the metallic electrodes and the aqueous (e.g. Ni) solution) which aids in the reduction of metal (e.g. Ni) ions from the solution to their metallic form (e.g. Ni) on the surface of the electrodes. The following reaction (1) is then taking place in a bath comprising nickel sulfate or nickel nitrate:

$$Ni^{2+}(aq) + 2e^- \rightarrow Ni(s) \qquad (1)$$

Figure 6:
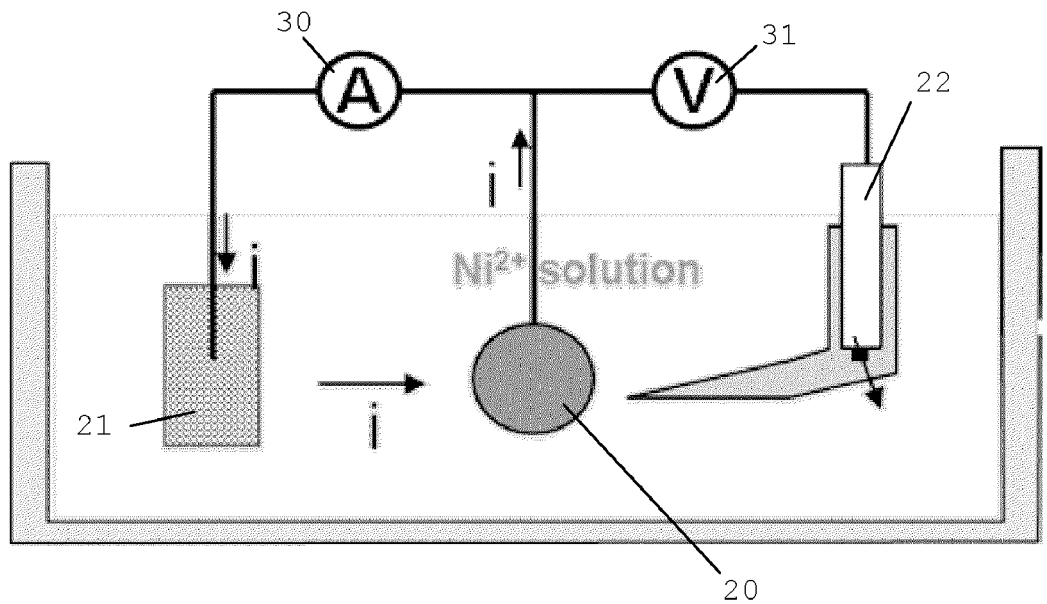
FIG. 6 illustrates the step of removing the sacrificial layer.

FIG. 6 illustrates a setup usable for the ECD deposition of a Ni particle. The substrate 20 provided with the electrode pair(s) is connected to a counter electrode 21 via current source 30, and to a reference electrode 22 via voltage source 31. The ECD process applied in the method of the disclosure can be conducted in any known ECD tool and according to known ECD process technology.

Figure 7:
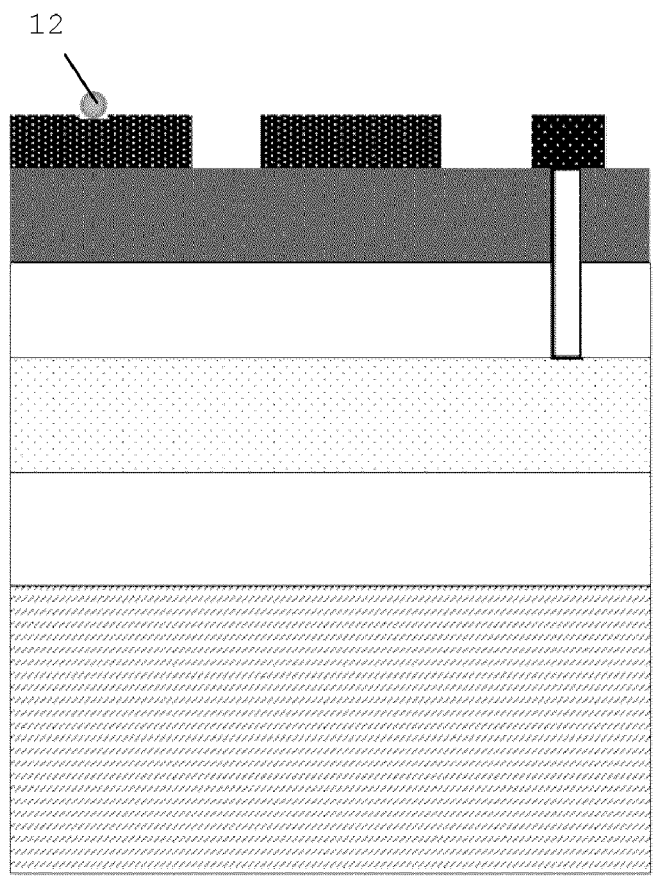
FIG. 7 illustrates a (simplified) set-up for performing electrochemical deposition to deposit catalytic nanoparticles according to preferred embodiments of the disclosure.

After deposition of the catalyst nanoparticle, the sacrificial layer is removed, see FIG. 7, e.g. in the case of Ni deposited on TiN: by rinsing the sample with acetone which dissolves the e-Beam resist, while not attacking the deposited Ni. The amount of catalyst deposited in the ECD deposition step can be controlled by: optimizing (by restricting) the concentration of catalyst in the ECD bath and/or optimizing the deposition potential and time in the case of deposition at constant voltage, or alternatively, optimizing the deposition current and charge in the case of deposition at constant current.

Figure 8:
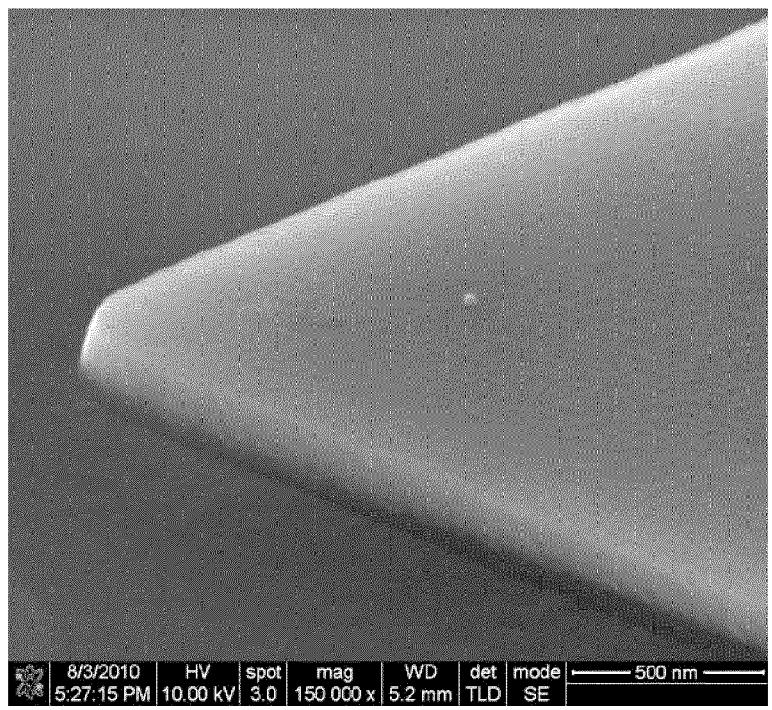
FIG. 8 illustrates an SEM picture of a localized and controlled Ni deposition from an electrochemical bath comprising nickel sulfate and sodium citrate (pH=6.9) on TiN electrodes according to the disclosure. The confined area of deposition was achieved by exposing holes of 70 nm diameter by using electron beam lithography on multiple electrodes.

In the case of Ni as the catalyst, and TiN as the electrode material, optimized values have been established for the above parameters, which allow the deposition of a single Ni nanoparticle, as shown in FIG. 8. The bath composition was 0.1M NiSO$_4$+0.1M Na$_3$C$_6$H$_5$O$_7$ (pH=6.9; 'M' is used to express molarity, 1M=1 mol/liter=10$^3$ mol/m$^3$). The sacrificial layer was a PMMA layer (Polymethylmethacrylate). The confined area of deposition was achieved by exposing holes of 70 nm diameter by using electron beam lithography on multiple electrodes. The applied voltage during deposition was −1.65V, defined relative to the reference electrode. The deposition time was 500 ms. Another bath composition that can be used is Ni(NO$_3$)$_2$+NaCl+NH$_4$Cl: pH=8.3 (Nitrate bath)

Broader ranges of these parameters define a preferred embodiment of the disclosure for the deposition of Ni on TiN, namely: concentration of Ni-species (NiSO$_4$ or Ni(NO$_3$)$_2$)—between 0.01M and 1M; voltage—between −1.3V and −1.8V, relative to a reference electrode; deposition time—between 100 ms and 2 seconds. When parameters are applied within these ranges, one or more nanoparticles are deposited in the hole. More than one nanoparticle may be deposited when the parameters are within the above ranges but not fully optimized. Another reason why more than one nanoparticle is deposited may be because of pinholes in the resist layer.

When more than one nanoparticle is deposited, a supplemental treatment may be applied according to a preferred embodiment of the disclosure. The supplemental treatment is performed after the removal of the sacrificial layer. Its purpose is to establish the coalescing of several nanoparticles into a single particle. This supplemental treatment is preferably a heating step, wherein the substrate is heated to a temperature above the melting point of the catalyst nanoparticles (which is lower than the melting temperature of the bulk catalyst material). Suppose that 2 or a small number of ECD-deposited Ni particles are in close vicinity to each other. When this system is heated up, the nanoparticles melt and because there is a greater tendency to form Ni—Ni bonds in the molten state than for Ni—TiN bonds, the nanoparticles tend to coalesce and form one bigger particle. This is not a universal effect, but depends on the choice of the substrate. The supplemental step can also be a plasma treatment.

According to another embodiment, the deposition of the catalyst nanoparticle takes place by a physical vapor deposition step in stead of ECD. For example, a Ni layer of 1 nm or 2 nm thickness can be deposited by PVD in a PVD tool and according to PVD process technology known in the art, on top of the sacrificial layer 10 provided with a hole 11 in which the underlying metal layer (preferably an electrode) is exposed. After stripping the sacrificial layer (preferably a resist layer), the PVD process applied with an appropriate mask design therefore also results in catalyst deposition in a selected area (defined by the small hole), which is therefore another embodiment of the step of 'providing a nanoparticle' in the hole. Like the ECD process, the PVD process may result in more than one nanoparticle being deposited. As in the case of the catalyst deposition by ECD, a supplemental thermal or plasma step may therefore be applied after the production of the catalyst nanoparticle(s) by PVD.

The growth of a single carbon nanotube on one of the electrodes of an electrode pair is achieved by optimizing the electrochemical deposition process in order to deposit either one catalyst nano particle per deposition site or a small enough cluster of nano particles, which during in-situ thermal (or plasma) treatment before the CNT growth coalesce into one nano particle.

Figure 9:
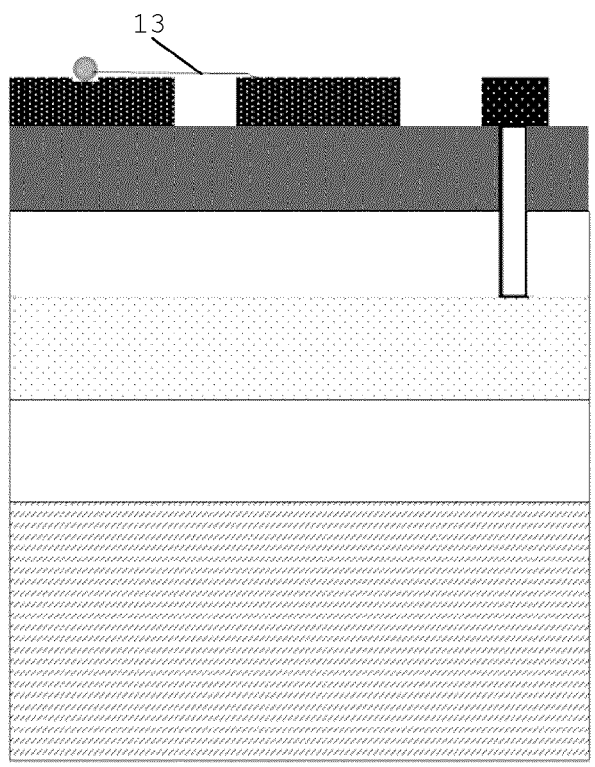
FIG. 9 illustrates the step of growing a single CNT onto the catalytic nanoparticle, whereby the growth of the CNT is horizontal and parallel to the surface of the substrate and towards the opposite electrode.

In a second aspect of the disclosure, a method is disclosed for providing (growing) a nanostructure (CNT) 13 having a desired horizontal alignment (see FIG. 9). The horizontal growth (alignment) makes it possible to bridge e.g. the gap in between 2 electrodes of an electrode pair (as shown in FIG. 9) which is desired for the use of CNT in MEMS and NEMS applications.

The growth of the nanostructure (a single CNT) itself is carried out preferably in a low pressure Chemical Vapor Deposition (CVD) chamber, more preferably a Plasma-Enhanced Chemical Vapor Deposition (PE-CVD) chamber at temperatures ranging from 400° C. to 700° C. The carbon source of the (PE-CVD) process is preferably selected from methane, ethylene, or acetylene with or without carrier gases like Ar and $N_2$. The CNT growth is typically carried out at low pressures ranging from 1 torr to 4 torr. The plasma used in the growth chamber can either be generated by a 13.56 MHz radio frequency plasma generator or be a remote microwave plasma.

The horizontal growth can be achieved by either of the following techniques known in the art: applying a local electric field with the help of electrical wires being bonded to the electrode structures or by using in-situ electric field created by the plasma in the growth chamber between the electrode structures.

Figure 10A:
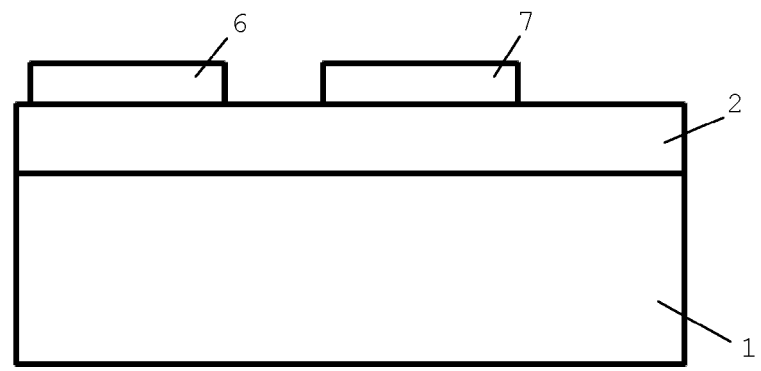
FIGS. 10a and 10b illustrate two possible cases wherein a biasing of the substrate holder during CNT growth results in a directional growth of the CNT.
Figure 10B:
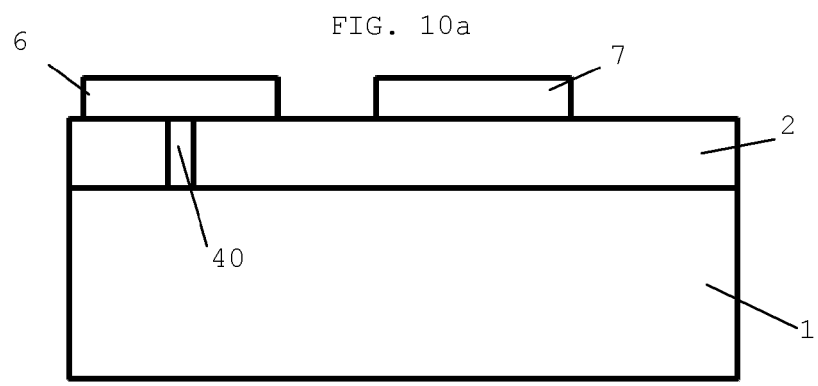

According to a preferred embodiment of the disclosure, the horizontal growth is achieved by biasing the stage (i.e. the holder) on which the sample is placed in the PE-CVD chamber, thereby creating a localized electric field between the electrodes. The electrode bias acting on the (Si) substrate helps in creating a localized electric field at the CNT growth sites inducing the horizontal alignment. This is illustrated in FIGS. 10a and 10b. In the case of FIG. 10a, the electrodes 6/7 are deposited onto an oxide layer 2 present on a silicon substrate 1. In this scheme, when the Si substrate is biased through the wafer holder of the (PE) CVD chamber, both the electrodes couple to the substrate capacitively and because of the electrode geometry (the triangular structures) the electric field is concentrated around the tips. In the case of FIG. 10b, an electrical connection is present between one electrode 6 and the Silicon substrate 1. In this scheme, when the Si substrate is biased through the wafer holder of the (PE) CVD chamber, the electrode 6 (and possible other electrodes connected thereto) is also biased through the substrate and the other floating electrode 7 couples to the substrate capacitively, which develops a localized electric field between the electrodes.

The stage (or the sample-holder) in the growth chamber may be biased with a DC voltage.

Figure 11:
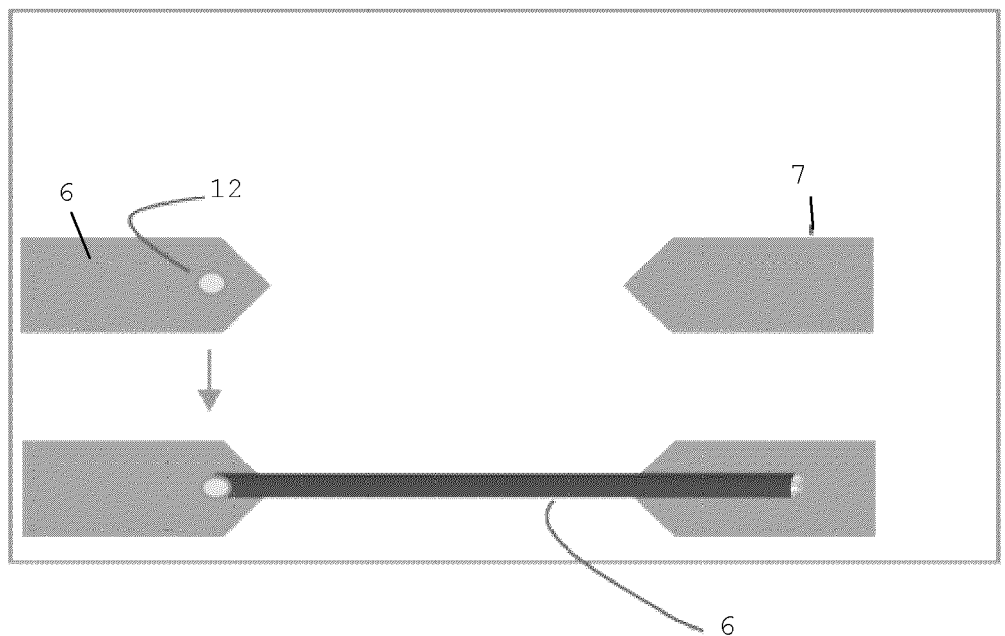
FIG. 11 illustrates the horizontal growth (alignment) of a single CNT such that it is possible to bridge e.g. the gap in between 2 electrodes of an electrode pair according to preferred embodiments of the disclosure.

FIGS. 9 and 11 illustrate the step of growing a single CNT onto the catalytic nanoparticle (after removal of the patterned photosensitive layer 10), whereby the growth of the CNT is horizontal and parallel to the surface of the substrate and towards the opposite electrode. FIG. 11 illustrates the horizontal growth (alignment) of a single CNT such that it is possible to bridge e.g. the gap in between 2 electrodes of an electrode pair.

The (directional) growth of a single CNT between two opposing electrodes thereby bridging the gap between the two opposing electrodes directly results in a suspended double clamped CNT which can act as a resonator as it is free to move between the gap spanning the opposing electrodes. This configuration is suitable for use in many practical MEMS (NEMS) applications like, but not limited to, resonator arrays or as nano hinges for micro (nano) mirror arrays.

Using Plasma-Enhanced Chemical Vapor Deposition (PE-CVD) for growth of CNT at lower temperatures e.g. 450° C. has the advantage that the process is suitable for above-IC integration and compatible with Si back-end of line processing.

Figure 12A:
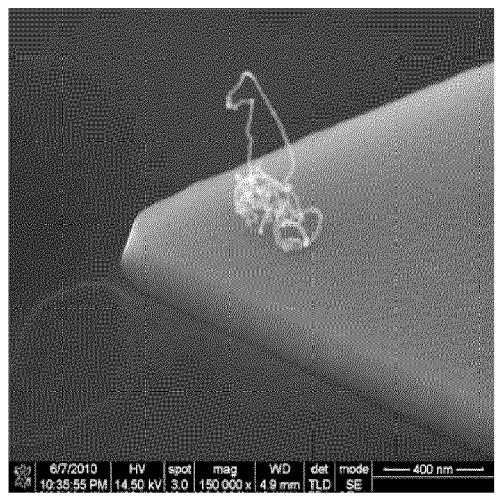
FIGS. 12a-12c illustrate localized CNT growth from a single Ni nanoparticle deposited by electrochemical deposition according to preferred embodiments of the disclosure.
Figure 12B:
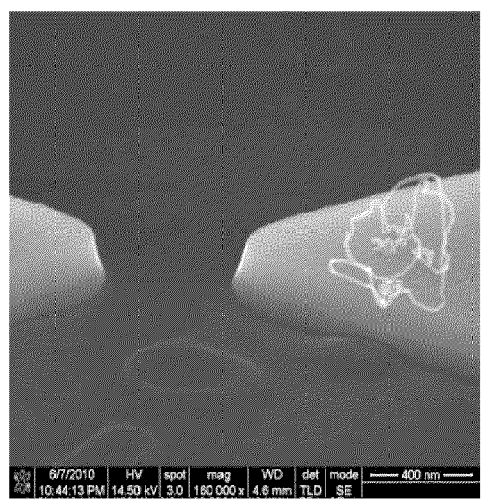
Figure 12C:
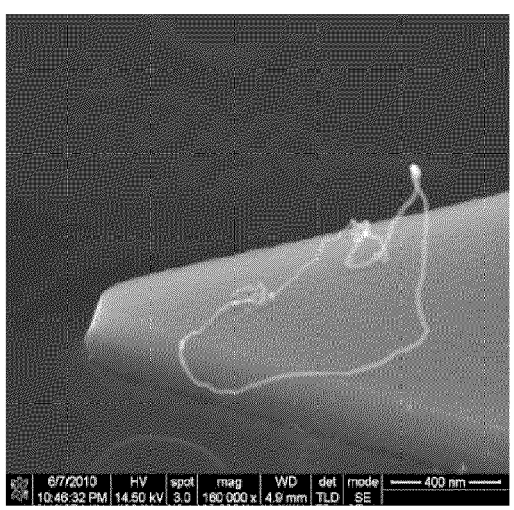

FIG. 12 illustrates localized CNT growth from single Ni nanoparticles deposited by electrochemical deposition according to preferred embodiments of the disclosure.

While the disclosure has been illustrated and described in detail in the drawings and foregoing description, such illustration and description are to be considered illustrative or exemplary and not restrictive.

The disclosure is not limited to the disclosed embodiments. Variations to the disclosed embodiments can be understood and effected by those skilled in the art in practicing the claimed disclosure, from a study of the drawings, the disclosure, and the appended claims.

All references cited herein are incorporated herein by reference in their entirety. To the extent publications and patents or patent applications incorporated by reference contradict the disclosure contained in the specification, the specification is intended to supersede and/or take precedence over any such contradictory material.

Unless otherwise defined, all terms (including technical and scientific terms) are to be given their ordinary and customary meaning to a person of ordinary skill in the art, and are not to be limited to a special or customized meaning unless expressly so defined herein. It should be noted that the use of particular terminology when describing certain features or aspects of the disclosure should not be taken to imply that the terminology is being re-defined herein to be restricted to include any specific characteristics of the features or aspects of the disclosure with which that terminology is associated.

Terms and phrases used in this application, and variations thereof, especially in the appended claims, unless otherwise expressly stated, should be construed as open ended as opposed to limiting. As examples of the foregoing, the term 'including' should be read to mean 'including, without limitation,' 'including but not limited to,' or the like; the term 'comprising' as used herein is synonymous with 'including,' 'containing,' or 'characterized by,' and is inclusive or open-ended and does not exclude additional, unrecited elements or method steps; the term 'having' should be interpreted as 'having at least;' the term 'includes' should be interpreted as 'includes but is not limited to;' the term 'example' is used to provide exemplary instances of the item in discussion, not an exhaustive or limiting list thereof; adjectives such as 'known', 'normal', 'standard', and terms of similar meaning should not be construed as limiting the item described to a given time period or to an item available as of a given time, but instead should be read to encompass known, normal, or standard technologies that may be available or known now or at any time in the future; and use of terms like 'preferably,' 'preferred,' 'desired,' or 'desirable,' and words of similar meaning should not be understood as implying that certain features are critical, essential, or even important to the structure or function of the invention, but instead as merely intended to highlight alternative or additional features that may or may not be utilized in a particular embodiment of the invention. Likewise, a group of items linked with the conjunction 'and' should not be read as requiring that each and every one of those items be present in the grouping, but rather should be read as 'and/or' unless expressly stated otherwise. Similarly, a group of items linked with the conjunction 'or' should not be read as requiring mutual exclusivity among that group, but rather should be read as 'and/or' unless expressly stated otherwise.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity. The indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. Any reference signs in the claims should not be construed as limiting the scope.

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

All numbers expressing quantities of ingredients, reaction conditions, and so forth used in the specification are to be understood as being modified in all instances by the term 'about.' Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

Furthermore, although the foregoing has been described in some detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the invention.

What is claimed is:

1. A method for providing a catalyst nanoparticle on a metal surface, wherein the catalyst nanoparticle is suitable for growing a nanostructure such as a carbon nanotube, the method comprising:
    providing a substrate having a metal layer on at least a portion of a surface of the substrate;
    depositing a sacrificial layer on the metal layer;
    producing a hole in the sacrificial layer, thereby exposing the metal layer;
    providing a single catalyst nanoparticle in the hole; and
    removing the sacrificial layer, whereby a catalyst nanoparticle on the metal surface is provided.

2. The method according to claim 1, wherein the metal layer is at least one pair of electrodes.

3. The method according to claim 1, wherein producing the hole is performed by electron beam lithography or advanced optical lithography.

4. The method according to claim 1, wherein the sacrificial layer is a photosensitive layer.

5. The method according to claim 1, wherein the hole is from 50 nm to 100 nm in diameter.

6. The method according to claim 1, wherein the catalyst nanoparticle comprises a material selected from the group consisting of Ni, Co, Fe, and alloys thereof with Mo.

7. The method according to claim 1, wherein the single catalyst nanoparticle is selectively provided in the hole.

8. The method according to claim 7, wherein the single catalyst nanoparticle is provided using electro chemical deposition from a bath comprising metal salts.

9. The method according to claim 7, wherein the metal salts comprise nickel sulfate or sodium salts.

10. The method according to claim 8, wherein the catalyst nanoparticle comprises Ni, wherein the metal layer is a layer of TiN, and wherein the bath comprises a Ni-containing species, where a concentration in the bath of the Ni-containing species is from 0.01M to 1M, wherein the electro chemical deposition takes place at a constant voltage applied to the substrate, wherein the voltage is from −1.3V to −1.8V relative to a reference electrode, and wherein the electro chemical deposition takes place in a time span of from 100 ms to 2s.

11. The method according to claim 1, wherein the catalyst nanoparticle is provided in the hole using physical vapor deposition.

12. The method according to claim 7, wherein providing a single catalyst nanoparticle in the hole comprises:
   depositing a plurality of nanoparticles in the hole and/or in a vicinity of the hole; and
   heating the substrate to a temperature above the melting point of the particles, whereby at least a portion of the plurality of nanoparticles coalesces into a single nanoparticle in the hole.

13. The method according to claim 1, further comprising growing a single carbon nanostructure on the catalytic nanoparticle in a chemical vapor deposition chamber at a temperature ranging from 400° C. to 700° C.

14. The method according to claim 1, wherein the chemical vapor deposition chamber is a plasma-enhanced chemical vapor deposition chamber.

15. The method according to claim 14, wherein a carbon source for the chemical vapor deposition is selected from the group consisting of methane, ethylene, acetylene, and mixtures thereof with a carrier gas, and wherein growing the single carbon nanostructure on the catalytic nanoparticle is carried out at a pressure of from 1 torr to 4 torr with a 13.56 MHz radio frequency plasma generator or a remote microwave plasma.

16. The method according to claim 15, wherein the carrier gas is selected from the group consisting of Ar, $N_2$, and mixtures thereof.

17. The method according to claim 14, wherein the metal layer is at least one pair of electrodes, wherein the a single carbon nanostructure is provided on top of one of the electrodes, and wherein the single carbon nanostructure exhibits horizontal growth achieved by biasing a sample holder in the plasma-enhanced chemical vapor deposition chamber, whereby a localized electric field between the electrodes is created.

\* \* \* \* \*